US005935404A

United States Patent [19]
Farooq et al.

[11] Patent Number: 5,935,404
[45] Date of Patent: Aug. 10, 1999

[54] METHOD OF PERFORMING PROCESSES ON FEATURES WITH ELECTRICITY

[75] Inventors: Shaji Farooq; Suryanarayana Kaja, both of Hopewell Junction; Hsichang Liu, Fishkill; Karen P. McLaughlin, Poughkeepsie; Gregg B. Monjeau, Wallkill; Kim Hulett Ruffing, Briarcliff Manor, all of N.Y.

[73] Assignee: International Business Machines Corporation, Armonk, N.Y.

[21] Appl. No.: 08/787,071

[22] Filed: Jan. 22, 1997

[51] Int. Cl.⁶ ......................................................... C25D 5/02
[52] U.S. Cl. ........................... 205/125; 205/118; 205/640
[58] Field of Search .................................. 205/125, 114, 205/118, 78, 118.1; 174/52.4

[56] References Cited

U.S. PATENT DOCUMENTS

| | | | |
|---|---|---|---|
| 5,087,331 | 2/1992 | Roll et al. | 205/118 |
| 5,240,588 | 8/1993 | Uchida | 205/125 |
| 5,290,423 | 3/1994 | Helber, Jr. et al. | 205/114 |
| 5,342,992 | 8/1994 | Noto | 174/52.4 |
| 5,516,416 | 5/1996 | Canaperi et al. | 205/78 |

OTHER PUBLICATIONS

Desai, et al., "Strippable Thin FIlm Circuit for Electroplating of Substrates", IBM Technical Disclosure Bulletin, V. 28, #9, Feb. 1986, pp. 3868–3869.

Burgess, et al., "General–Purpose Module Plating" IBM Technical Disclosure Bulletin, V. 32, #5B, Oct. 1989, pp. 448–449.

*Primary Examiner*—Kathryn Gorgos
*Assistant Examiner*—Erica Smith-Hicks
*Attorney, Agent, or Firm*—Tiffany L. Townsend; Steven J. Soucar

[57] ABSTRACT

A method of performing electrochemistry processes on features and connectors of a substrate includes the application of a shorting layer across the connectors which are in electrical contact with the features, thereby shorting the features and creating an assemblage for which electricity is applied.

10 Claims, 1 Drawing Sheet

METHOD OF PERFORMING PROCESSES ON FEATURES WITH ELECTRICITY

TECHNICAL FIELD

This invention generally relates to performing electroplating process that require that a shortening layer be present. More particularly, the invention relates to electroplating and electroetching of features such as pins by shorting the pins at remote connectors such as control collapse chip connection pads.

BACKGROUND OF THE INVENTION

Packages that receive integrated circuit chips include a substrate that has input/output (I/O) pins on a surface. The I/O pins are attached to the substrate to form an array that is referred to as a Pin Grid Array (PGA). As chips and packages assume increased function, there is a need for a higher number of I/O pins. This increases both the density and the number of pins in the array, and requires populating the surface completely with pins.

The I/O pins should be uniformly electroplated to deposit a metal or alloy, e.g., gold, thereon to satisfy performance requirements. As illustrated in FIG. 1, electroplating is conventionally performed on a package 8 by taking a conductive plate 10, placing the conductive plate 10 in contact with pins 12 of the PGA 14 extending from a substrate 16 to short out the pins 12, placing the conductive plate 10 and pins 12 in an electroplating bath (not shown) containing an electroplating solution and applying a current to the conductive plate 10 to effect electroplating. As PGAs become more densely packed and fully populated, the solution cannot flow freely about all the pins 12 due to the presence of the conductive plate 10 resulting in performance loss due to nonuniform electroplating. Undesirably, there is thicker plating deposition on the outer pins 18 and progressively thinner deposition on interior pins 20. This condition of non-uniform plating is further exacerbated by a decrease in the length of the pins and by any increase in the density of the array. Similar shortcomings will occur with other processes such as electroetching, leading to non-uniform etch rates.

A method of performing a process using electricity in the process on a feature such as a pin that overcomes some of the aforementioned shortcomings is highly desirable.

SUMMARY OF THE INVENTION

The invention provides a novel way of performing processes that use electricity in their performance on features that are part of a package used in the semiconductor industry. The features are on a first surface and in electrical contact with connectors. The connectors are shorted out using a shorting layer to create an assemblage of the features, connectors and shorting layer. Electricity is applied to the assemblage and the process is then performed. By shorting the connectors rather than the features, the features are fully exposed to a solution used in the process.

Numerous other advantages and features of the present invention will become readily apparent from the following detailed description of the preferred embodiments and the appended claims.

DETAILED DESCRIPTION OF THE PREFERRED EMBODIMENTS

Although this invention is susceptible to embodiment in many different forms, there are described in detail herein, presently preferred embodiments of the invention. It should be understood, however, that the present disclosure is to be considered as an exemplification of the principles of this invention and is not intended to limit the invention to the embodiments described.

The present method is suitable for use in processes that use electricity in the performance of the process on at least two features. The present method is particularly well suited for use on packages that receive computer chips wherein the features are on a substrate of the package. The features extend from, are flush with or depressed in the substrate surface. The features are in electrical communication with connectors that extend from, are flush with or depressed in the substrate surface. Representative processes include electroplating, electroetching (e.g., of a pin, pad, braze or the like), electropolishing and the like. Representative features include pins, tabs, lead frames, pads, the like and combinations thereof. Representative connectors include controlled collapse chip connect (C4) balls, bumps and pads, microsockets/pads, capacitor pads, engineering change pads, the like and combinations thereof. Preferably, the connectors are not present solely for the purpose of performing the process but rather have a purpose in addition thereto.

Figure 1:
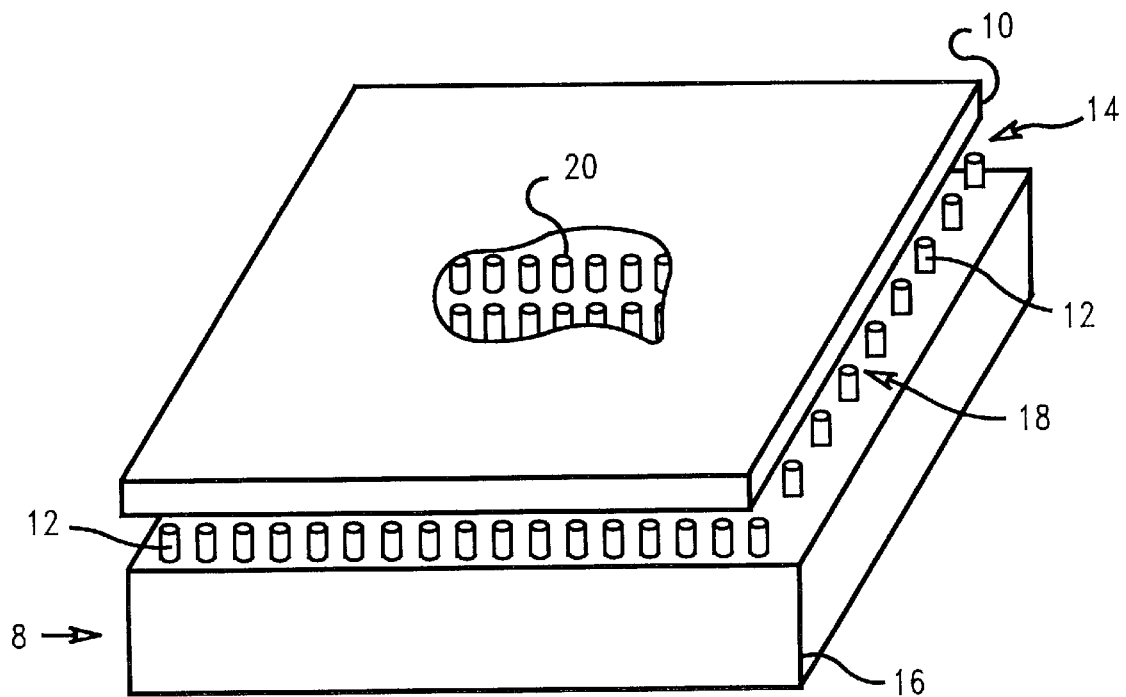
FIG. 1 is a view of the prior art arrangement for electroplating pins wherein the conductive plate is partially broken away to reveal the interior pins.
Figure 2:
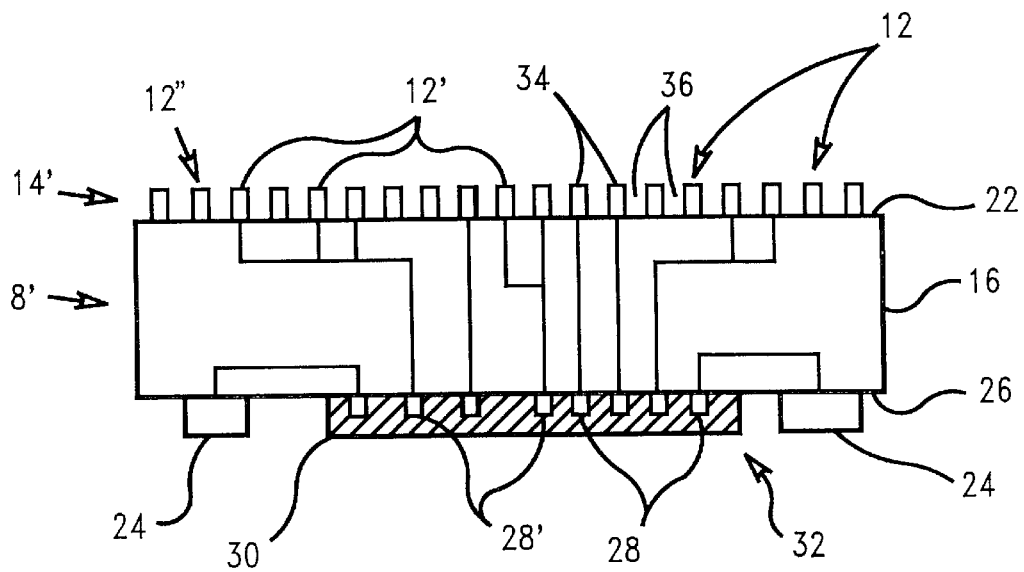
FIG. 2 is a side cross-sectional view of a package on which the method of the present invention is being performed.

In the following description of the method, pins and pads will be used as features and electroplating will be used as the process. One skilled in the art will recognize that the method is applicable to other features and processes. Referring to FIG. 2 (which is not to scale), a package 8' includes a substrate 16 having pins 12 in a PGA 14' extending from a first surface 22. Pads 24 are on a second surface 26 along with connectors 28, illustrating that the features and connectors can be on the same surface. In an alternative embodiment that is not illustrated, the first and second surfaces 22 and 26, respectively, are not opposite surfaces of the substrate 16. The pins 12 and pads 24 are in electrical contact with the connectors 28 through the substrate 16. Some connectors 28' are in contact with multiple pins 12'. Some pins 12" are not in electrical contact with the connectors 28 that are shown but rather may be in contact with connectors that are not shown but which will be shorted if they are to be plated. A shorting layer 30 electrically connects the connectors 28, thereby shorting them and the pins 12 and pads 24 to create an assemblage 32 of features, e.g., the pins 12 and the pads 24, and shorting layer 30.

Electricity is then provided to the assemblage 32 by contact with any of the pins 12, pads 24, connectors 28 or shorting layer 30, and areas that do not need plating are insulated, and the whole substrate is immersed in a process solution. For example, the shorting layer is insulate to prevent it from getting plated. The process is then performed in its conventional manner. Because pin ends 34 distal from the substrate 16 are not covered and therefore are exposed, the electroplating solution (not shown) can flow from the distal end 34 into spaces 36 between the pins 12 to effect electroplating.

The shorting layer is a conductive paste, evaporated metal deposit, mechanical shorting element, e.g., a piece of metal, or the like. Conductive paste and evaporated metal deposits are preferred because they provide uniform contact which is difficult to achieve with the mechanical element and they also apply less stress on the connectors than the mechanical element. Preferably, the shorting layer encapsulates the connectors. Preferred conductive pastes use flakes as opposed to spheres as the shape of the conductive material. When a paste or evaporation deposited metal is used, it should be readily removable after the electroplating or etching is complete.

The present method permits the height of the features to be reduced and permits the features to be placed closer together to increase the feature density without adversely affecting the process performed on the features. In essence, there is no lower limit to the feature height or opening between the features with this method. For example, features having a height in the range of about 0.001 to about 0.25 inches have been successfully electroplated. The spacing (distance) between features can also be reduced. For example, the distance between feature centers can be in the range of about 0.050 to about 0.1 inches.

It presently is theorized that the above-described advantages are achieved because the features are open on all surfaces other than that which abuts the substrate to permit flow about the feature without the hinderance associated with a plate across the feature. Features can be more closely packed together. Further, the features can be made smaller because extra size is not needed to contribute to spacing to permit solution to flow between the substrate and plate.

The method is especially advantageous when multiple features are closely packed so that the use of a plate to provide electrical contact across the features to short out the features could inhibit the flow of a solution about the features, reducing efficacy of the process. The present method is particularly suited for electroplating pins that are in a PGA and which are in electrical contact with C4 pads, or any other array of features which is in contact with C4 balls, bumps or pads, and for electroetching braze in pin joints.

This invention has been described in terms of specific embodiments set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

We claim:

1. A method of performing a process requiring electricity on a feature, the feature being on a substrate, the method comprising the steps of:

a) providing a substrate having a first side with at least two features and a second side with a plurality of connectors, the two features electrically isolated from one another and in electrical communication with at least one connector;

b) applying a shorting layer to the second side of the substrate, such that none of the features are in contact with the shorting layer;

c) supplying a current for shorting the connectors and creating an assemblage.

2. The method of claim 1 further comprising the step of removing the short means.

3. The method of claim 1 wherein the features are pins.

4. The method of claim 3 wherein the pins have lengths in the range of about 0.001 to about 0.25 inches.

5. The method of claim 1 wherein the features centers are spaced a distance in the range of about 0.050 to about 0.1 inches apart.

6. The method of claim 1 wherein the connectors are controlled collapse chip connection pads, balls or bumps.

7. The method of claim 1 wherein the features are flush with the substrate surface.

8. The method of claim 1 wherein the features are not flush with the substrate surface.

9. The method of claim 1 wherein the connectors are flush with the substrate surface.

10. The method of claim 1 wherein the connectors are not flush with the substrate surface.

* * * * *